(12) United States Patent
Weare et al.

(10) Patent No.: US 11,705,542 B2
(45) Date of Patent: Jul. 18, 2023

(54) BINDER MATERIALS FOR LIGHT-EMITTING DEVICES

(71) Applicant: CreeLED, Inc., Durham, NC (US)

(72) Inventors: Walter Weare, Pittsboro, NC (US); Derek Miller, Raleigh, NC (US); Brian T. Collins, Holly Springs, NC (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 238 days.

(21) Appl. No.: 17/002,320

(22) Filed: Aug. 25, 2020

(65) Prior Publication Data

US 2022/0069172 A1 Mar. 3, 2022

(51) Int. Cl.
*H01L 33/50* (2010.01)
*H01L 33/58* (2010.01)

(52) U.S. Cl.
CPC .......... *H01L 33/501* (2013.01); *H01L 33/505* (2013.01); *H01L 33/58* (2013.01); *H01L 33/504* (2013.01); *H01L 33/508* (2013.01); *H01L 2933/0041* (2013.01); *H01L 2933/0091* (2013.01)

(58) Field of Classification Search
CPC ..... H01L 33/501; H01L 33/505; H01L 33/58; H01L 33/504; H01L 33/508
See application file for complete search history.

(56) References Cited

U.S. PATENT DOCUMENTS 7,042,020 B2   5/2006   Negley
8,866,169 B2   10/2014  Emerson et al.
9,070,850 B2   6/2015   Keller et al.
9,461,201 B2   10/2016  Heikman et al.
9,887,327 B2   2/2018   Reiherzer et al.
(Continued)

FOREIGN PATENT DOCUMENTS

WO   2017197392 A1   11/2017

OTHER PUBLICATIONS

Fu et al., "Preparation of alumina films from a new sol-gel route," Thin Solid Films, vol. 348, No. 1-2, Jul. 1999, pp. 99-102.
(Continued)

*Primary Examiner* — Mark W Tornow
(74) *Attorney, Agent, or Firm* — Withrow & Terranova, P.L.L.C.

(57) ABSTRACT

Solid-state lighting devices including light-emitting diodes (LEDs), and more particularly binder materials for light-emitting devices are disclosed. A lumiphoric material for a light-emitting device may include lumiphoric particles embedded within a binder material. The lumiphoric material may be formed according to sol-gel chemistry techniques where a solution of binder precursors and lumiphoric particles is applied to a surface, dried to reduce liquid phase, and fired to form a hardened and dense lumiphoric material. The binder precursors may include metal oxide precursors that result in a metal oxide binder. In this manner, the lumiphoric material may have high thermal conductivity while also being adaptable for liquid-phase processing. In further embodiments, binder materials with or without lumiphoric particles may be utilized in place of conventional encapsulation materials for light-emitting devices.

28 Claims, 8 Drawing Sheets

(56) References Cited

U.S. PATENT DOCUMENTS

| | | | |
|---|---|---|---|
| 10,290,777 B2 | 5/2019 | Andrews et al. | |
| 10,468,565 B2 | 11/2019 | Pun et al. | |
| 10,879,434 B2* | 12/2020 | Chen | H01L 33/52 |
| 2001/0041025 A1 | 11/2001 | Farahi | |
| 2014/0306244 A1* | 10/2014 | Oraw | H01L 33/40 438/29 |
| 2015/0255688 A1* | 9/2015 | Stoll | C09K 11/883 252/301.4 F |
| 2017/0098746 A1 | 4/2017 | Bergmann et al. | |
| 2019/0326484 A1 | 10/2019 | Welch et al. | |
| 2020/0116322 A1* | 4/2020 | Eberhardt | C09K 11/7774 |

OTHER PUBLICATIONS

Li et al., "New insights into the microstructure oftranslucent CaAlSiN3:Eu2+ phosphor ceramics for solid-state laser lighting," Journal of Materials Chemisty C, No. 5, Dec. 28, 2016, pp. 1042-1051.

Marikkannan et al., "A Novel Synthesis of Tin Oxide Thin Films by the Sol-gel Process for Optoelectronic Applications," AIP Advances, vol. 5, No. 2, Feb. 13, 2015, pp. 027122-1-027122-8.

Shinen et al., "Preparation of Titanium Dioxide (TiO2) via the Sol-Gel Process," Journal of Babylon University, Pure and Applied Sciences, vol. 20, No. 1, 2012, pp. 232-240.

International Search Report and Written Opinion for International Patent Application No. PCT/US2021/046206, dated Dec. 1, 2021, 14 pages.

\* cited by examiner

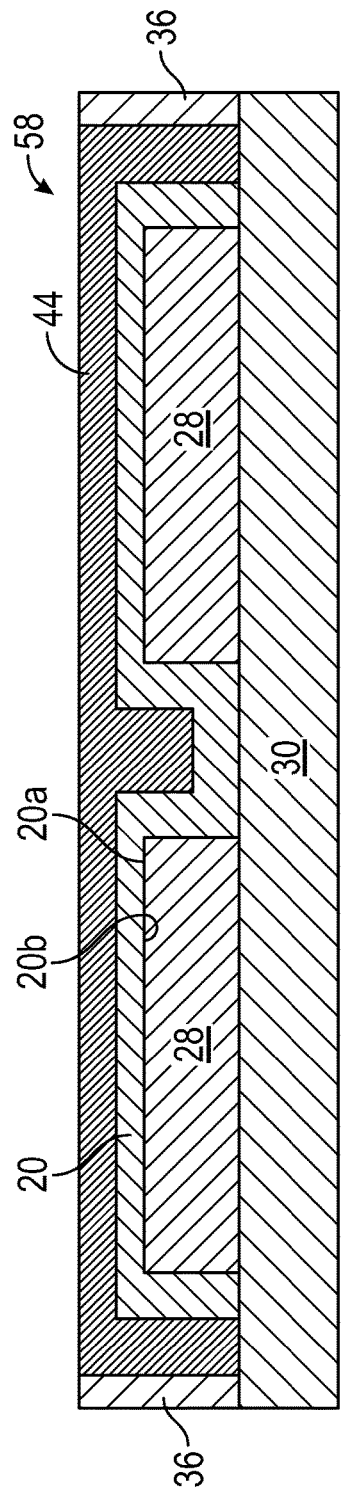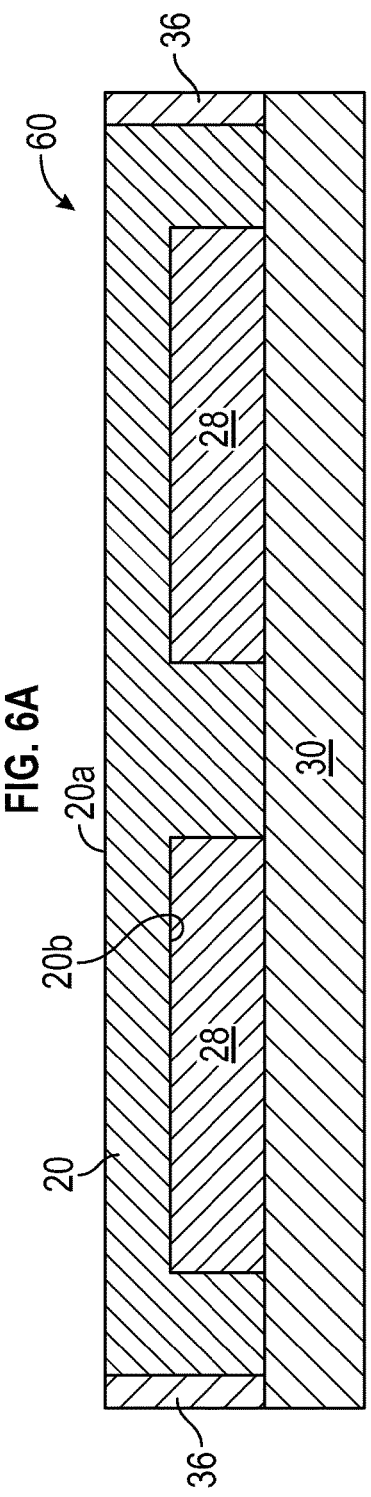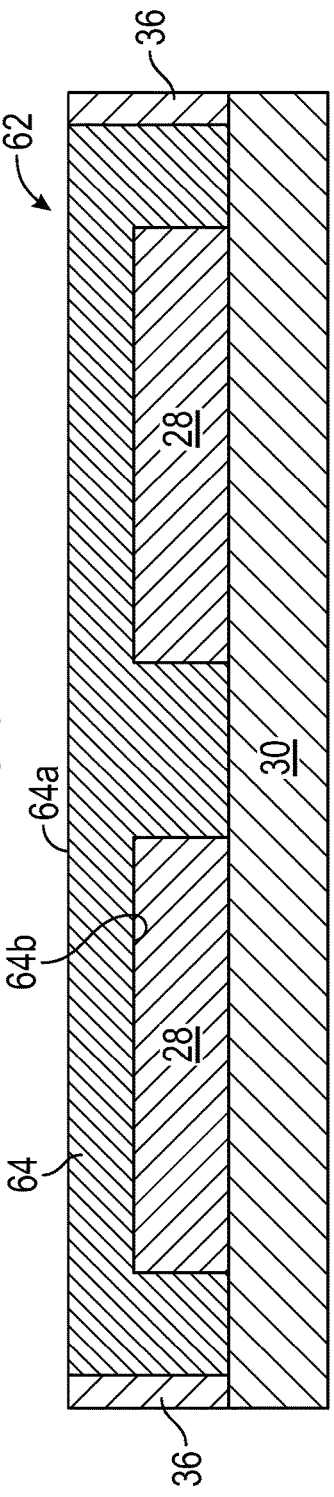

BINDER MATERIALS FOR LIGHT-EMITTING DEVICES

FIELD OF THE DISCLOSURE

The present disclosure relates to solid-state lighting devices including light-emitting diodes (LEDs), and more particularly to binder materials for light-emitting devices.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including light loss due to internal absorption and degradation of various packaging elements associated with the LED.

LED packages have been developed that can provide mechanical support, electrical connections, and encapsulation for LED emitters. Light emissions that exit surfaces of LED emitters may then interact with elements or surfaces of corresponding LED packages. Lumiphoric materials, such as phosphors, may also be arranged in close proximity to LED emitters to convert portions of light emissions to different wavelengths. In operation, LED emitters are known to generate heat when electrically activated. Such heat can adversely impact performance and reliability if left unaccounted for. As such, there can be challenges in producing high quality light with desired emission characteristics while also providing high light emission efficiency and reliability in LED packages.

The art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs), and more particularly to binder materials for light-emitting devices. A lumiphoric material for a light-emitting device may include lumiphoric particles embedded within a binder material. The lumiphoric material may be formed according to sol-gel chemistry techniques where a solution of binder precursors and lumiphoric particles is applied to a surface, dried to reduce liquid phase, and fired to form a hardened and dense lumiphoric material. The binder precursors may include metal oxide precursors that result in a metal oxide binder. In this manner, the lumiphoric material may have high thermal conductivity while also being adaptable for liquid-phase processing. In further embodiments, binder materials with or without lumiphoric particles may be utilized in place of conventional encapsulation materials for light-emitting devices.

In one aspect, a light-emitting device comprises: a LED chip; and a lumiphoric material arranged to receive light emitted by the LED chip, the lumiphoric material comprising a plurality of lumiphoric particles in a binder, the lumiphoric material comprising a density of at least 1.8 grams per centimeter cubed ($g/cm^3$) and a weight percentage of lumiphoric particles that is at least 70%. In certain embodiments, the binder comprises a metal oxide binder, for example a metal oxide binder that comprise one or more of tin (Sn) and aluminum (Al), among other metals. In certain embodiments, the density is in a range from 1.8 $g/cm^3$ to 10 $g/cm^3$. In certain embodiments, the weight percentage of lumiphoric particles is at least 90%. The lumiphoric material may comprise a thermal conductivity in a range from 10 watts per meter per Kelvin (W/(m·K)) to 50 W/(m·K). In certain embodiments, the lumiphoric material forms a nonplanar shape. The nonplanar shape may comprise a lens with a curved upper surface. In certain embodiments, the lumiphoric material comprises a first face and a second face that opposes the first face, wherein the plurality of lumiphoric particles are provided within the binder such that a region of the binder that is adjacent the first face is devoid of the plurality of lumiphoric particles. In certain embodiments, the region of the binder that is devoid of the plurality of lumiphoric particles comprises a thickness in a range from 5 microns (μm) to 15 μm as measured from the first face In certain embodiments, the plurality of lumiphoric particles comprises a first distribution of lumiphoric particles and a second distribution of lumiphoric particles and the first distribution of lumiphoric particles is configured to provide a different wavelength of light emissions than the second distribution of lumiphoric particles. The first distribution of lumiphoric particles and the second distribution of lumiphoric particles may be mixed together in the binder or provided in separate layers of the binder. In certain embodiments, the lumiphoric material is provided on a light-transmissive support element. In certain embodiments, the LED chip is mounted on a submount and the lumiphoric material is provided on the LED chip and on a surface of the submount that is uncovered by the LED chip.

In another aspect, a light-emitting device comprises: a LED chip; and a lumiphoric material arranged to receive light emitted by the LED chip, the lumiphoric material comprising a plurality of lumiphoric particles in a binder, the lumiphoric material comprising a thickness of less than 100 microns (μm) and a thermal conductivity in a range from 10 W/(m·K) to 50 W/(m·K). In certain embodiments, the binder comprises a metal oxide binder. In certain embodiments, the thickness is in a range from 15 μm to less than 100 μm. In certain embodiments, the lumiphoric material comprises a first face and a second face that opposes the first face, wherein the plurality of lumiphoric particles are provided within the binder such that a region of the binder that is adjacent the first face is devoid of the plurality of lumiphoric particles. The region of the binder that is devoid of the plurality of lumiphoric particles may comprise a thickness in a range from 5 µm to 15 µm as measured from the first face. In certain embodiments, the lumiphoric material is provided on a light-transmissive support element.

In another aspect, a light-emitting device comprises: a LED chip; and an encapsulation material arranged to at least partially encapsulate the LED chip, the encapsulation material comprising a binder with a thermal conductivity in a range from 10 W/(m·K) to 50 W/(m·K). In certain embodiments, the encapsulation material completely encapsulates the LED chip. In certain embodiments, the binder comprises a metal oxide binder. In certain embodiments, the encapsulation material forms a coating on the LED chip. In certain embodiments, the encapsulation material comprises a plurality of light-scattering particles in the binder. In certain embodiments, the encapsulation material comprises a plurality of light-scattering particles and a plurality of lumiphoric particles in the binder.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 6A is a cross-sectional view of an LED package where a lumiphoric material is provided on multiple LED chips and a corresponding submount according to principles of the present disclosure.

FIG. 6B is a cross-sectional view of an LED package that is similar to the LED package of FIG. 6A, but where the lumiphoric material is formed to also embody a lens over the multiple LED chips.

FIG. 7A is a cross-sectional view of an LED package that is similar to the LED package of FIG. 6B, but where an encapsulation material is formed according to the process flow of FIG. 1 without lumiphoric particles.

DETAILED DESCRIPTION

Figure 1:
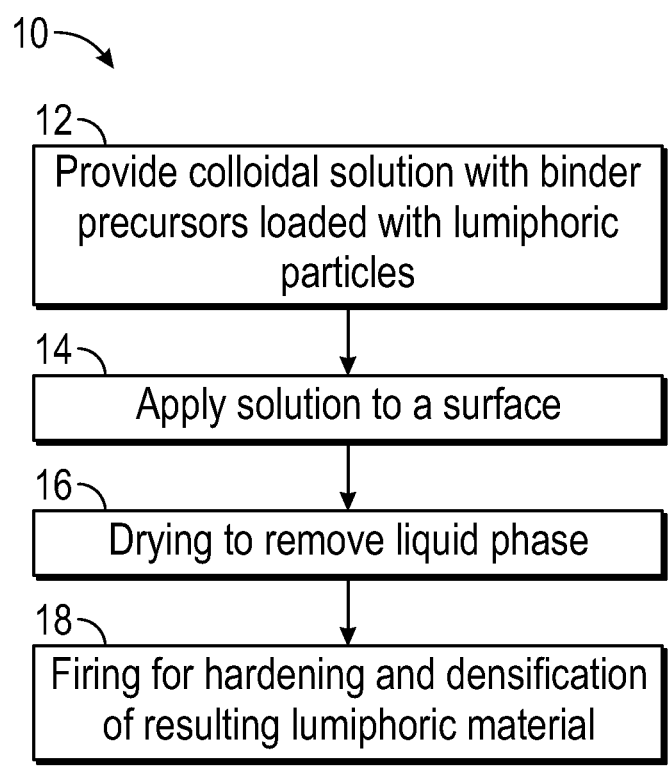
FIG. 1 is a schematic diagram illustrating an exemplary process flow for fabrication of a lumiphoric material according to sol-gel principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs), and more particularly to binder materials for light-emitting devices. A lumiphoric material for a light-emitting device may include lumiphoric particles embedded within a binder material. The lumiphoric material may be formed according to sol-gel chemistry techniques where a solution of binder precursors and lumiphoric particles is applied to a surface, dried to reduce liquid phase, and fired to form a hardened and dense lumiphoric material. The binder precursors may include metal oxide precursors that result in a metal oxide binder. In this manner, the lumiphoric material may have high thermal conductivity while also being adaptable for liquid-phase processing. In further embodiments, binder materials with or without lumiphoric particles may be utilized in place of conventional encapsulation materials for light-emitting devices.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500 Kelvin (K) to 10,000K. In further embodiments, the color temperature range may be from 1500K to 10,000K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, one or more surfaces of LED chips may be conformally coated with one or more lumiphoric materials, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element. Wavelength conversion elements may include a support element, such as a superstrate, and one or more lumiphoric materials that are provided by any suitable means, such as by coating a surface of the superstrate or by incorporating within the superstrate. The term "superstrate" as used herein refers to an element placed on or over an LED chip that may include a lumiphoric material. The term "superstrate" is used herein, in part, to avoid confusion with other substrates that may be part of the semiconductor light-emitting device, such as a growth or carrier substrate of the LED chip or a submount of an LED package. The term "superstrate" is not intended to limit the orientation, location, and/or composition of the structure it describes. In some embodiments, the superstrate may be composed of a transparent material, a semi-transparent material, or a light-transmissive material, such as sapphire, SiC, silicone, and/or glass (e.g., borosilicate and/or fused quartz). Superstrates may be patterned to enhance light extraction as described in commonly-assigned U.S. Patent Application Publication No. 2019/0326484 entitled "Semiconductor Light Emitting Devices Including Superstrates With Patterned Surfaces" which is hereby incorporated by reference herein. Superstrates may also be configured as described in commonly-assigned U.S. Pat. No. 10,290,777, also incorporated by reference herein. Superstrates may be formed from a bulk substrate which is optionally patterned and then singulated. In certain embodiments, the patterning of a superstrate may be performed by an etching process (e.g., wet or dry etching). In certain embodiments, the patterning of a superstrate may be performed by otherwise altering the surface, such as by a laser or saw. In certain embodiments, the superstrate may be thinned before or after the patterning process is performed. In certain embodiments, superstrates may comprise a generally planar upper surface that corresponds to a light emission area of the LED package.

One or more lumiphoric materials may be arranged on the superstrate by, for example, spraying and/or otherwise coating the superstrate with the lumiphoric materials. Wavelength conversion elements may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. In certain embodiments, a vertical geometry or lateral geometry LED chip may be configured as set forth in the commonly-assigned U.S. Pat. No. 9,461,201, which is hereby incorporated by reference herein. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In certain embodiments, the flip-chip LED chip may be configured as described in commonly-assigned U.S. Patent Application Publication No. 2017/0098746, which is hereby incorporated by reference herein. In other embodiments, an active LED structure may be bonded to a carrier submount, and the growth substrate may be removed such that light may exit the active LED structure without passing through the growth substrate. In certain embodiments, an LED package may be configured as set forth in the following commonly-assigned U.S. patents, which are hereby incorporated by reference herein: U.S. Pat. Nos. 8,866,169; 9,070,850; 9,887,327; and 10,468,565.

According to aspects of the present disclosure LED packages may include one or more elements, such as lumiphoric materials, encapsulants, light-altering materials, lens, and electrical contacts, among others, that are provided with one or more LED chips. In certain aspects, an LED package may include a support member, such as a submount or a leadframe. Light-altering materials may be arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index of refraction that is configured to refract light emissions in a desired direction. In certain aspects light-reflective particles may also be referred to as light-scattering particles. A weight ratio of the light-reflective particles or light-scattering particles to a binder may comprise a range of about 1:1 to about 2:1. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast. In certain embodiments, the light-altering material includes both light-reflective material and light-absorbing material suspended in a binder.

In certain aspects, light-altering materials may be provided in a preformed sheet or layer that includes light-altering particles suspended in a binder. For example, light-altering particles may be suspended in a binder of silicone that is not fully cured to provide the preformed sheet of light-altering materials. A desired thickness or height of the preformed sheet may be provided by moving a doctor blade or the like across the sheet. The preformed sheet may then be positioned on and subsequently formed around an LED chip and/or a wavelength conversion element that is on the LED chip. For example the preformed sheet may be laminated around the LED chip and/or wavelength conversion element and then the preformed sheet may be fully cured in place. One or more portions of the preformed sheet may then be removed from a primary light-emitting face of the LED chip and/or wavelength conversion element. In this manner, light-altering materials may be formed along peripheral edges or sidewalls of the LED chip and wavelength conversion element with thicknesses not previously possible with conventional dispensing techniques typically used to form light-altering materials. Additionally, light-altering materials may be provided without needing conventional submounts or lead frames as support for conventional dispensing and/or molding techniques. In this regard, LED devices with light-altering materials may be provided with reduced footprints suitable for closely-spaced LED arrangements.

In typical applications, lumiphoric materials, such as ceramic phosphor particles, require encapsulation for mechanical robustness and occasionally for optical purposes. Typical encapsulation materials include a polymer binder of organic silicone or epoxy that provide the ability for fabrication in a liquid state with simple processing. While such polymer binder materials are commonly used, they do exhibit low thermal conductivities on the order of 0.1-0.5 watts per meter per Kelvin (W/(m·K)), thereby providing very poor thermal dissipation characteristics. In operation, an LED chip is known to generate heat when electrically activated. If unaccounted for, such heat can adversely impact encapsulation materials and lumiphoric materials leading to degraded device performance and reliability, particularly in high lumen output applications. For example, lumiphoric materials may overheat and shift converted wavelengths away from desired targets. Additionally, the encapsulation material of the binder may experience hardening, cracking or color shifting.

More recently, phosphors have been encapsulated in a glass as a so-called phosphor-in-glass (PiG) or in ceramic as a so-called phosphor-in-ceramic (PiC) or ceramic phosphor plate (CPP). PiGs and PiCs/CPPs are typically formed by pressing and sintering phosphors with glass or ceramic particles at high pressure and temperature to form transparent and dense planar sheets that are subsequently diced into flat rectangular pieces that may be attached to LEDs. The required high pressure and high temperature limits the end use to planar shapes and can also degrade phosphor performance. For example, an exemplary phosphor material may initially exhibit a quantum yield of 90% and after high temperature processing, the quantum yield may drop 15-20% or more. Additionally, typical glass materials used in PiGs also suffer from poor thermal conductivity on the order of less than 1.0 W/(m·K). While CiPs/CPPs may provide thermal conductivities higher than 1.0 W/(m·K), they still suffer from the above-described degraded quantum yields due to high temperatures required for sintering.

According to principles of the present disclosure, lumiphoric materials with high thermal conductivity are provided that are also capable of liquid-phase processing. In certain embodiments, principles of sol-gel chemistry are employed to provide such improved lumiphoric materials where a colloidal solution (sol) serving as a binder is loaded with lumiphoric particles, formed as a liquid, dried into a gel and then fired at relatively low temperatures (e.g., <250° C.) to form hardened and dense lumiphoric particle-loaded structures. The colloidal solution may be formed with chemical glass or ceramic precursors such as metal oxide precursors. By way of example, the colloidal solution may include precursors of tin (Sn) oxides or aluminum (Al) oxides. The lumiphoric particles may include one or more distributions of phosphor particles configured to provide one or more different wavelengths of light in response to received light emissions. The resulting lumiphoric material may have a form factor capable of matching any current polymer binder processing capability while also providing notably higher thermal conductivity, on the order of at least 10 W/(m·K), or in a range from 10 W/(m·K) to 50 W/(m·K) in certain embodiments. In this manner, lumiphoric particles may experience lower operating temperatures under load, thereby yielding improved brightness and reliability. In certain embodiments, the sol-gel process may be specifically selected to provide a resulting lumiphoric material having a high density in order to provide the higher thermal conductivity. For example, the lumiphoric material may have a density of at least 1.8 grams per centimeter cubed (g/cm$^3$), or at least 2 g/cm$^3$, or in a range from either of the preceding values to 10 g/cm$^3$. Additionally, the resulting lumiphoric material may be able to have improved loading of lumiphoric particles compared with conventional PiGs, PiCs, and CPPs, such as a lumiphoric material that has a weight percentage of lumiphoric particles that is at least 70%, or at least 80%, or at least 90%, or at least 95%, thereby allowing the lumiphoric material to have a lower overall thickness compared with conventional devices. For example, the thickness of the lumiphoric material may be less than 100 microns (μm), or less than 80 μm, or less than 50 μm, or in a range that includes any of the preceding values with a lower boundary of 15 μm or 20 μm depending on the application and the particle size of the lumiphoric particles. For comparison, conventional PiGs, PiCs, and CPPs have thicknesses that exceed 100 μm due to structural stability and phosphor loading requirements. Additionally, the principles of the present disclosure are also applicable to lumiphoric materials with greater thicknesses if needed for a particular application. For example, the thickness of the lumiphoric material may be as high as 1 millimeter (mm) depending on the application.

FIG. 1 is a schematic diagram illustrating a process flow 10 for fabrication of a lumiphoric material according to sol-gel principles of the present disclosure. In a first fabrication step 12, a colloidal solution is provided that includes binder precursor materials loaded with lumiphoric particles. For a resulting lumiphoric material with higher thermal conductivity as described above, the binder precursors may include one or more precursors selected to form a resulting metal oxide binder, such as a binder of one or more oxides of aluminum (Al), tin (Sn), titanium (Ti), zinc (Zn), zirconia (Zr), Mg, and spinels that include Mg and/or Al (e.g., $Mg_xAl_yO_z$). By way of example, metal oxides of Al may include $Al_2O_3$ and aluminosilicates and metal oxides of Sn may include $SnO_2$ in final form. At the completion of the first fabrication step 12, the colloidal solution may at least partially form in liquid phase, although some gel-like characteristics may also be present.

At a second fabrication step 14, the colloidal solution may be applied to a surface on which the resulting lumiphoric material may reside. For example, the surface may comprise an LED chip and/or a submount on which the LED chip is mounted. The surface may alternatively comprise a support element, such as a light-transparent or light-transmissive superstrate or a lens that may be attached or mounted over an LED chip. Since the colloidal solution is in at least partial liquid form, the colloidal solution may be applied to any surface with any form factor with ease, including nonplanar form factors that are not possible with conventional PiCs and CPPs. Additionally, the colloidal solution is able to be applied according to a variety of application methods, including but not limited to dispensing, spraying, and spin coating, among others.

In a third fabrication step 16, the colloidal solution may be subjected to a drying process after application to the surface as described in the second fabrication step 14. The drying process may be employed to remove remaining liquid phase or solvent from the solution. By way of example, the drying process may include drying at room temperature for a number of hours to remove the liquid phase, although other drying temperatures and times may also be used. After drying, the solution may form a gel with increased density compared to the solution before drying.

In a fourth fabrication step 18, a firing process is applied for hardening and final densification of the resulting lumiphoric material. The metal oxide binder may form an amorphous solid structure with the lumiphoric particles embedded therein. The metal oxide binder may also be referred to as a metal oxide glass or a sol-gel glass. Notably, the firing temperatures are substantially lower than corresponding temperatures for conventional PiGs, PiCs, and CPPs. For example, the firing temperature for the fourth fabrication step 18 may be less than 250° C. In this manner, the firing temperature reduces negative impacts on quantum yields of the lumiphoric particles associated with higher firing temperatures of conventional devices. As previously described, exemplary phosphor particles may initially exhibit quantum yields of 90% and after conventional high temperature firing, the quantum yields may drop 15-20% or more. In the fourth fabrication step 18, the lower firing temperatures have little or no impact on quantum yields.

Figure 2A:
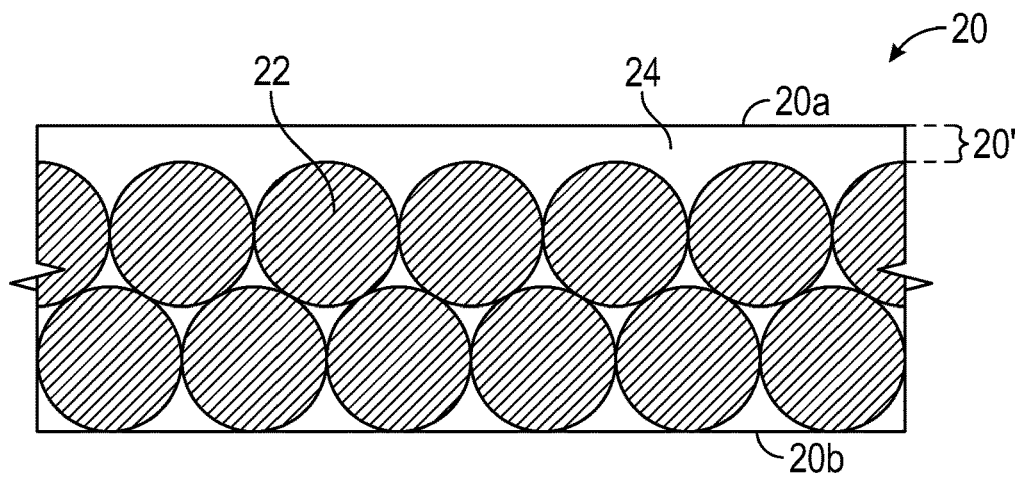
FIG. 2A is a cross-sectional view of a lumiphoric material that includes a plurality of lumiphoric particles in a binder according to the present disclosure.

FIGS. 2A-2D are cross-sectional views illustrating arrangements of lumiphoric materials that may be formed by the process flow 10 of FIG. 1. FIG. 2A is a cross-sectional view of a lumiphoric material 20 that includes a plurality of lumiphoric particles 22 in a binder 24. The lumiphoric material 20 includes a first face 20a and a second face 20b that opposes the first face 20a. The second face 20b may be formed at the interface with the surface on which the lumiphoric material 20 was formed according to the process flow 10 of FIG. 1. In this regard, the second face 20b may be closer to an LED chip or a support element for the lumiphoric material 20 than the first face 20a. During the drying process described in the third fabrication step 16 of FIG. 1, the lumiphoric particles 22 may be allowed to settle with greater density at or near the second face 20b as compared to the first face 20a. Any voids between the lumiphoric particles 22 may be filled with the binder material 24. In FIG. 2A, the lumiphoric particles 22 are illustrated with the same circular size, but in practice, the lumiphoric particles 22 may embody a distribution of particle sizes with a variety of non-uniform shapes that can be quantified with a mean particle size value.

The settling of the lumiphoric particles 22 may also form a region 20' at top of the lumiphoric material 20 with little or no lumiphoric particles 22. The region 20' may have a thickness as measured from a top of one of the lumiphoric particles 22 to the first face 20a. The region 20' may serve to ensure the lumiphoric particles 22 are fully encapsulated within the lumiphoric material 20 to provide mechanical stability and reduced exposure of the lumiphoric particles 22 outside of the lumiphoric material 20. In certain embodiments, the thickness of the region 20' may be less than a mean particle size of the lumiphoric particles 22. Depending on the desired emission wavelength, the lumiphoric particles 22 may comprise mean particle sizes in a range from 5 μm to 40 μm, or in a range from 10 μm to 30 μm. By way of a non-limiting example, the lumiphoric particles 22 may have a mean particle size of 15 μm to 16 μm and the thickness of the region 20' may be in a range from 5 μm to 10 μm. In other embodiments, the thickness of the region 20' may be formed thicker, such as in a range from 5 μm to 1 mm if needed.

Figure 2B:
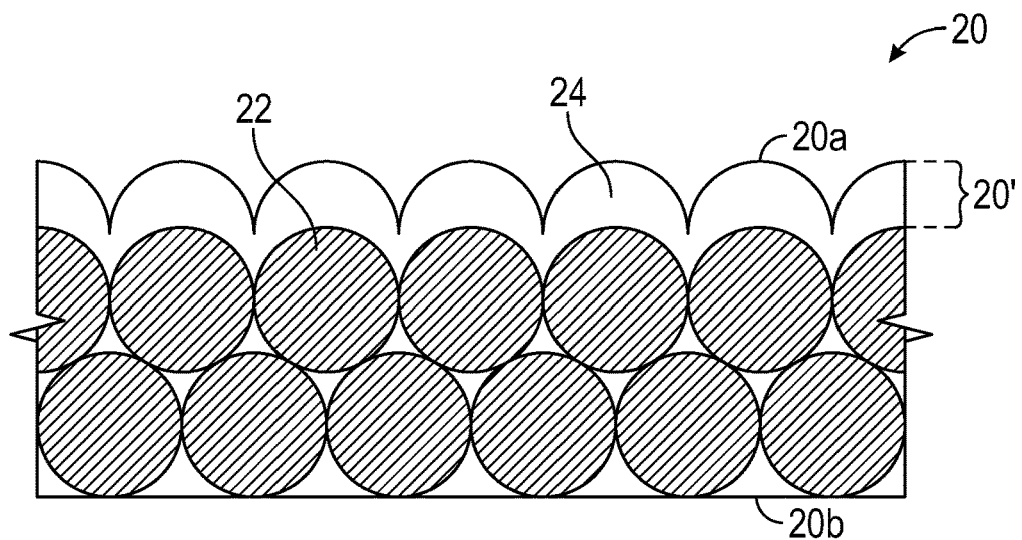
FIG. 2B is a cross-sectional view of the lumiphoric material of FIG. 2A, but where a first face of the lumiphoric material forms a nonplanar shape.

While the first face 20a of the lumiphoric material 20 is illustrated as planar in FIG. 2A, the first face 20a may be nonplanar in certain embodiments, particularly when the region 20' is formed with a reduced thickness. In this manner, FIG. 2B is a cross-sectional view of the lumiphoric material 20 of FIG. 2A, but where the first face 20a forms a nonplanar shape. In certain embodiments, the nonplanar shape may correspond with one or more shapes of the lumiphoric particles 22 after drying and firing. For example, the first face 20a may at least partially conform to a shape defined by top surfaces of the lumiphoric particles 22 just below the region 20'. While other figures of the present disclosure may be shown with planar first faces, it is understood that any of the embodiments disclosed herein may also have a nonplanar shapes as described above for FIG. 2B.

Figure 2C:
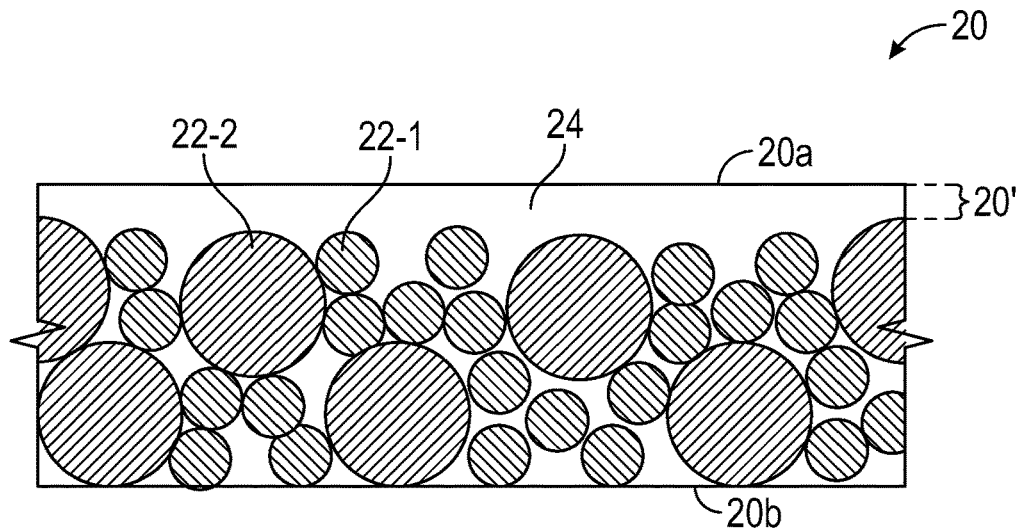
FIG. 2C is a cross-sectional view of the lumiphoric material of FIG. 2A where first and second distributions of lumiphoric particles are mixed together within a binder.

In certain applications, the lumiphoric particles 22 may include two or more distributions of lumiphoric particles 22 that are configured to provide different wavelength emissions. In this manner, FIG. 2C is a cross-sectional view of the lumiphoric material 20 of FIG. 2A where distributions of first and second lumiphoric particles 22-1, 22-2 are mixed together within the binder 24. The first lumiphoric particles 22-1 and the second lumiphoric particles 22-2 may be configured to provide different wavelength emissions from each other and may have the same or different mean particle sizes. For illustrative purposes, the second lumiphoric particles 22-2 are shown as larger circles than the first lumiphoric particles 22-1 in FIG. 2C. In practice, the first and second lumiphoric particles 22-1, 22-2 may include distributions of non-uniform shapes as previously described. When the first and second lumiphoric particles 22-1, 22-2 have different mean particle sizes, smaller particles may fill in gaps around larger particles and any voids may be filled with the binder 24. In certain embodiments, the second lumiphoric particles 22-2 may embody yellow and/or green phosphor particles while the first lumiphoric particles 22-1 may embody red phosphor particles, or vice versa. In further embodiments, the lumiphoric material 20 may include three or more distributions of lumiphoric particles without deviating from the principles of the present disclosure.

Figure 2D:
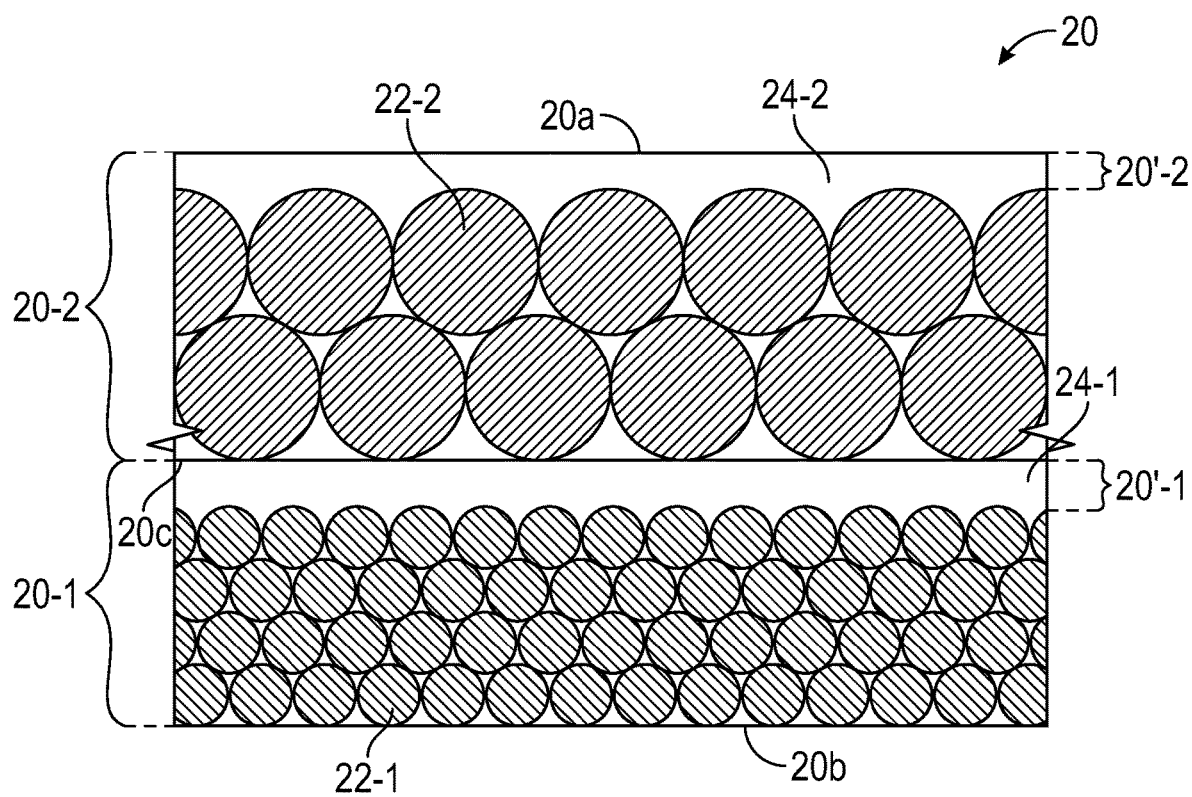
FIG. 2D is a cross-sectional view of the lumiphoric material of FIG. 2A for embodiments where the first and second lumiphoric particles of FIG. 2C are provided in separate layers or regions of the lumiphoric material.

FIG. 2D is a cross-sectional view of the lumiphoric material 20 of FIG. 2A for embodiments where the first and second lumiphoric particles 22-1, 22-2 of FIG. 2C are provided in separate layers or regions of lumiphoric materials 20-1, 20-2. In certain applications, it may be desirable to spatially separate the first and second lumiphoric particles 22-1, 22-2 from one another. For example, some red phosphor materials may have excitation spectrums that overlap with emission spectrums of yellow or green phosphor materials. As such, light that may initially be converted by the yellow or green phosphor material may subsequently be converted again by the red phosphor material, thereby limiting emission efficiencies for the overall device. In this regard, it may provide improved emission efficiency to position the red phosphor materials between the yellow/green phosphor materials and the light source (e.g., LED chip) in order to reduce interactions between yellow/green wavelengths of light and the red phosphor materials. As illustrated in FIG. 2D, the lumiphoric material 20 is divided into a first lumiphoric material 20-1 or layer and a second lumiphoric material 20-2 or layer. The first lumiphoric material 20-1 includes the first lumiphoric particles 22-1 in a first binder 24-1, and the second lumiphoric material 20-2 includes the second lumiphoric particles 22-2 in a second binder 24-2. In certain embodiments, the first lumiphoric material 20-1 may first be formed according to the process flow 10 of FIG. 1, followed by forming the second lumiphoric material 20-2 thereafter according to the process flow 10 of FIG. 1. As illustrated, an interface 20c may be defined between the first and second lumiphoric materials 20-1, 20-2 where the interface 20c forms a top face of the first lumiphoric material 20-1 and a surface on which the second lumiphoric material 20-2 may be formed. By following the process flow 10 of FIG. 1 separately for each of the lumiphoric materials 20-1, 20-2, first and second regions 20'-1 and 20'-2 may be formed that respectively have little or none of the first and second lumiphoric particles 22-1, 22-2. While FIG. 2D illustrates two sequentially-formed lumiphoric materials 20-1, 20-2, any number of lumiphoric materials or layers may be provided by sequentially repeating the process flow 10 of FIG. 1. While other figures of the present disclosure may represent the lumiphoric material 20 as a single layer for illustrative purposes, it is understood that the lumiphoric material 20 may have any number of layers as illustrated in FIG. 2D.

As previously described, lumiphoric materials according to the present disclosure may provide improved thermal conductivities and lumiphoric particle loading while also being able to be provided in a variety of form factors not otherwise possible. In certain embodiments, lumiphoric materials may be formed on another support element, such as a light-transparent or light-transmissive superstrate or a lens that may be subsequently attached or mounted over one or more LED chips. In alternative embodiments, lumiphoric materials may be formed on one or more LED chips and/or a corresponding submount on which the LED chips are mounted.

Figure 3A:
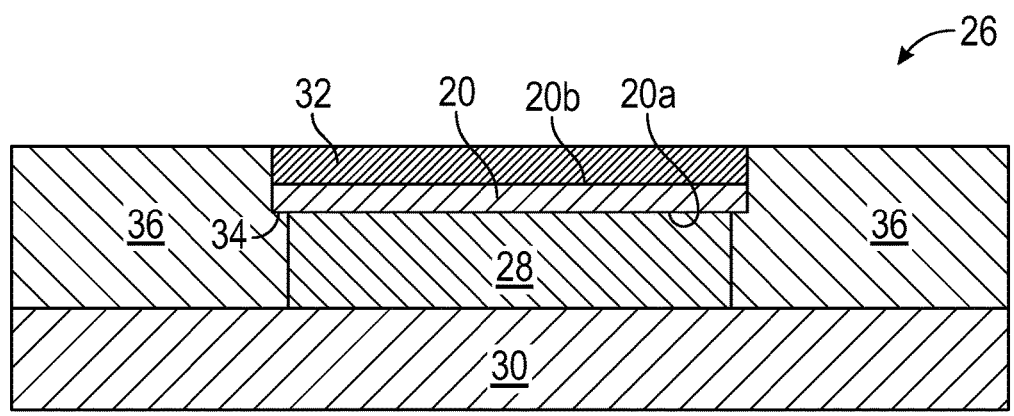
FIG. 3A is a cross-sectional view of a light-emitting diode (LED) package that includes a lumiphoric material on a support element that is over an LED chip according to principles of the present disclosure.
Figure 3B:
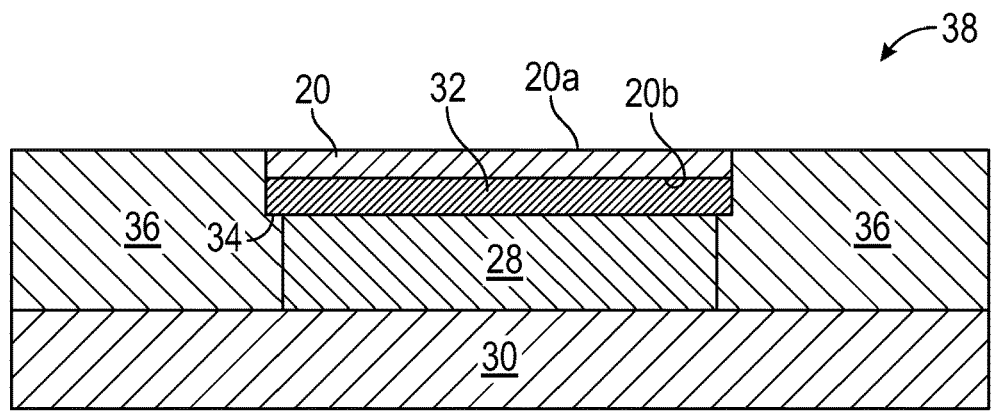
FIG. 3B is a cross-sectional view of an LED package that is similar to the LED package of FIG. 3A, but with a reverse arrangement of the lumiphoric material and the support element.
Figure 3C:
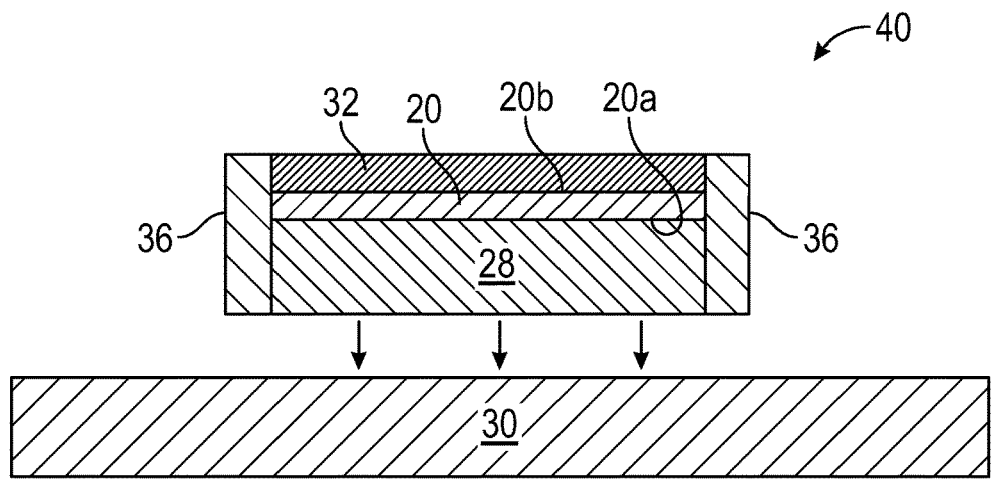
FIG. 3C is a cross-sectional view of an LED package that is similar to the LED package of FIG. 3A, but where the lumiphoric material, the support element, and a light-altering material are formed on the LED chip before mounting in the LED package.

FIGS. 3A-3C illustrate embodiments of LED packages where the lumiphoric material 20 as previously described is pre-formed before being arranged in a corresponding LED package. FIG. 3A is a cross-sectional view of an LED package 26 that includes an LED chip 28 that is mounted on a submount 30. The lumiphoric material 20 may first be formed on a support element or superstrate 32 before being attached or mounted over the LED chip 28 in the LED package 26. The superstrate 32 may embody a light-transmissive or light-transparent planar lens. In this regard, the second face 20b of the lumiphoric material 20 is arranged closer to the superstrate 32 than the first face 20a. After positioning, the lumiphoric material 20 may be arranged between the superstrate 32 and the LED chip 28 so that the superstrate 32 may provide additional environmental protection for the lumiphoric material 20.

As illustrated, the superstrate 32 and lumiphoric material 20 may be formed with lateral dimensions that are larger than lateral dimensions of the LED chip 28 for improved alignment, thereby forming an overhang portion 34 along one or more peripheral edges of the LED chip 28. Since the lumiphoric material 20 may be formed separately from the LED chip 28, the lumiphoric material 20 and the superstrate 32 may be formed across large areas that are subsequently singulated for individual attachment. In certain embodiments, a light-altering material 36 may be provided on the submount 30 and around one or more peripheral edges of the LED chip 28, the lumiphoric material 20 and the superstrate 32. The light-altering material 36 may partially or completely cover peripheral edges of the lumiphoric material 20 and the superstrate 32. In this regard, light that is emitted laterally by the LED chip 28 may be redirected by the light-altering material 36 toward the lumiphoric material 20 and the superstrate 32. In a similar manner, light that may be converted by the lumiphoric material 20 that propagates in a lateral direction may be redirected to pass through the superstrate 32 in a desired emission direction for the LED package 26. As illustrated, the light-altering material 36 may be formed to cover portions of the submount 30 that are uncovered by the LED chip 28. In certain embodiments, the light-altering material 36 may be dispensed or otherwise applied to the submount 30 after the superstrate 32 and lumiphoric material 20 are positioned on the LED chip 28. In other embodiments, the light-altering material 36 may be provided on the submount 30 before the superstrate 32 and the lumiphoric material 20 are positioned on the LED chip 28. While only one LED chip 28 is illustrated, the principles described herein are applicable to multiple LED chip 28 arrangements. For example, a plurality of the LED chips 28 may be arranged under the lumiphoric material 20 and the superstrate 32. Alternatively, a plurality of the LED chips 28 may each be arranged with their own lumiphoric material 20 and superstrate 32.

FIG. 3B is a cross-sectional view of an LED package 38 that is similar to the LED package 26 of FIG. 3A, but with a reverse arrangement of the lumiphoric material 20. In certain embodiments, the superstrate 32 may be provided between the lumiphoric material 20 and the LED chip 28. As previously described for FIGS. 2A-2D, portions of the lumiphoric material 20 that are at or near the first face 20a may have little or no lumiphoric particles, thereby providing environmental protection by way of the binder material (e.g., metal oxide). As with FIG. 3A, the principles of FIG. 3B are also applicable to multiple LED chip 28 arrangements.

FIG. 3C is a cross-sectional view of an LED package 40 that is similar to the LED package 26 of FIG. 3A, but where the lumiphoric material 20, the superstrate 32 and the light-altering material 36 are formed on the LED chip 28 before mounting on the submount 30. Such a sequence may be referred to as chip-level packaging where LED chips include additional packaging elements before final assembly in corresponding LED packages. As illustrated, the light-altering material 36 may be provided along peripheral edges of the LED chip 28, the lumiphoric material 20 and the superstrate 32. When fully assembled on the submount 30, the light-altering material 36 need not extend over an entire area of the submount 30. As with FIG. 3A, the principles of FIG. 3C are also applicable to multiple LED chip 28 arrangements. In particular, multiple ones of the LED chip 28 with chip-level packaging of the light-altering material 36, the lumiphoric material 20, and the superstrate 32 may be arranged on the common submount 30.

Figure 4A:
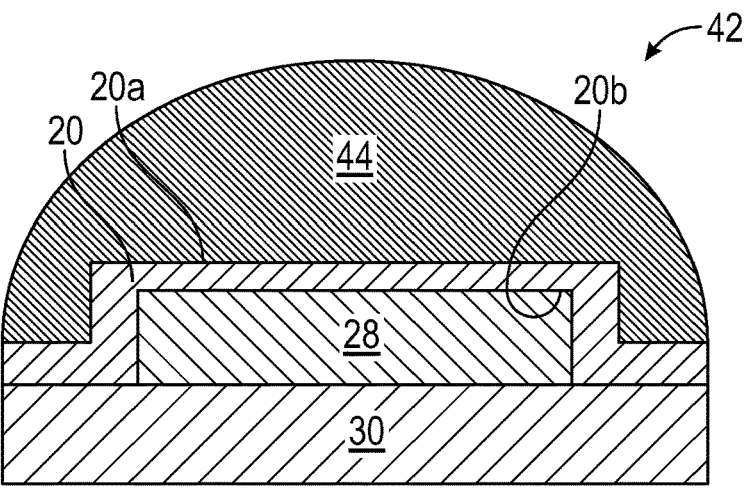
FIG. 4A is a cross-sectional view of an LED package where a lumiphoric material is formed in place on an LED chip and portions of a submount that are uncovered by the LED chip according to principles of the present disclosure.

FIGS. 4A-4D illustrate cross-sectional views of LED packages where lumiphoric materials may be provided as coatings or layers on LED chips without the use of pre-formed support structures. As previously described, lumiphoric materials with high thermal conductivity and improved lumiphoric particle loading may be formed non-planar shapes according to principles of the present disclosure. FIG. 4A is a cross-sectional view of an LED package 42 where the lumiphoric material 20 is formed in place on the LED chip 28 and portions of the submount 30 that are uncovered by the LED chip 28. In this manner, the colloidal solution of binder precursors and lumiphoric particles may be applied to the LED chip 28 and submount 30, and subsequently dried and fired in place to form the lumiphoric material 20. In certain embodiments, the lumiphoric material 20 may completely cover and encapsulate the LED chip 28 on the submount 30. As such, the LED package 42 may not require additional encapsulation materials to protect the LED chip 28. In certain embodiments, the first face 20a and the second face 20b of the lumiphoric material 20 form a shape that is conformal to a shape of the LED chip 28 and submount 30. Additionally, portions of the lumiphoric material 20 may laterally extend on the submount 30 away from peripheral edges of the LED chip 28. In this manner, the lumiphoric material 20 may form a coating on the LED chip 28 and portions of the submount 30. Optionally, a lens 44 may be provided on the lumiphoric material 20 to tailor a light emission pattern for the LED package 42. In the cross-sectional view of FIG. 4A, the lens 44 has a curved top surface that may correspond with at least a partial dome or hemispherical shape for the lens 44. In other embodiments, the lens 44 may have other shapes, for example oval, ellipsoid, cubic, rectangular cuboid, or a partial dome shape with one or more planar side surfaces. In certain embodiments, the lens 44 may be molded in place over the LED chip 28 and submount 30. The lens 44 may comprise a silicone material, glass, or epoxy that is conducive to molding. As illustrated, the lumiphoric material 20 may be formed entirely between the lens 44 and the submount 30 in certain embodiments. While only one LED chip 28 is illustrated, the principles described herein are applicable to multiple LED chip 28 arrangements. For example, multiple ones of the LED chip 28 may be provided in an array on the submount 30 and the lumiphoric material 20 may cover each of the LED chips 28 and portions of the submount 30 that are uncovered by the LED chips 28.

Figure 4B:
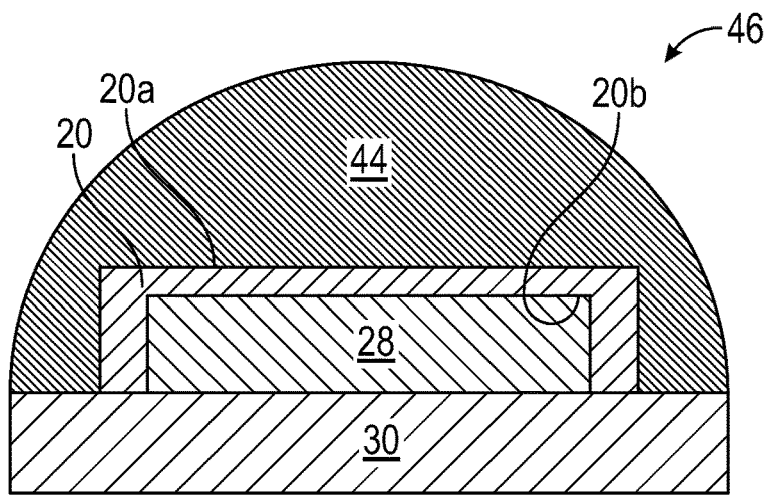
FIG. 4B is a cross-sectional view of an LED package that is similar to the LED package of FIG. 4A, but where portions of the lumiphoric material do not laterally extend on the submount as in the LED package of FIG. 4A.

FIG. 4B is a cross-sectional view of an LED package 46 that is similar to the LED package 42 of FIG. 4A, but where portions of the lumiphoric material 20 do not laterally extend on the submount 30 as in the LED package 42 of FIG. 4A. In this regard, the lens 44 may entirely surround and cover the lumiphoric material 20 on the submount 30. In certain embodiments, the lumiphoric material 20 may be applied, dried, and fired in place on the LED chip 28 before mounting on the submount 30. In other embodiments, the LED chip 28 may be mounted on the submount 30 and the lumiphoric material 20 may be applied through a mask that covers certain portions of the submount 30. As with the embodiments of FIG. 4A, the lumiphoric material 20 in FIG. 4B may completely cover and encapsulate the LED chip 28 on the submount 30, thereby not necessarily requiring additional encapsulation. Additionally, multiple ones of the LED chip 28 and the lumiphoric material 20 may be provided on the submount 30.

Figure 4C:
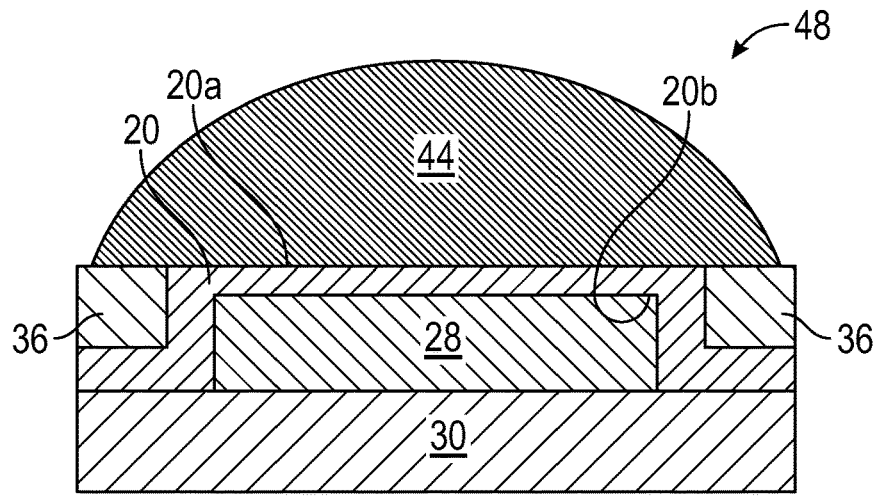
FIG. 4C is a cross-sectional view of an LED package that is similar to the LED package of FIG. 4A, and further includes a light-altering material arranged around peripheral edges of the LED chip.

FIG. 4C is a cross-sectional view of an LED package 48 that is similar to the LED package 42 of FIG. 4A, and further includes the light-altering material 36 arranged around peripheral edges of the LED chip 28. As illustrated, the lumiphoric material 20 may be applied, dried, and fired in place on the LED chip 28 in a conformal manner. The light-altering material 36 may then be applied on portions of the lumiphoric material 20 that are on the submount 30 and outside of an area of the LED chip 28 to redirect any laterally propagating light toward the lens 44 and in a desired emission direction. Depending on how wide the desired emission pattern for the LED package 48 may be, a height of the light-altering material 36 relative to the submount 30 maybe less than, the same, or greater than a height of the LED chip 28 relative to the submount 30. The lens 44 may reside on portions of the lumiphoric material 20 and the light-altering material 36.

Figure 4D:
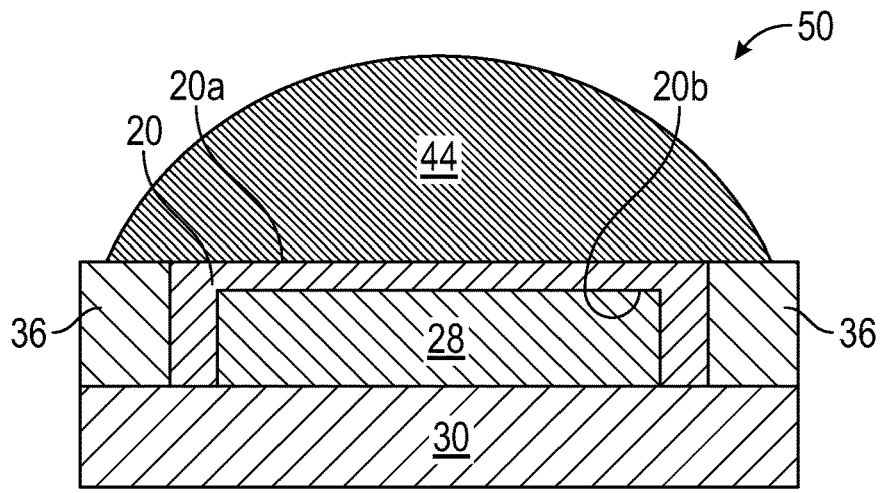
FIG. 4D is a cross-sectional view of an LED package that is similar to the LED package of FIG. 4B, and further includes a light-altering material arranged around peripheral edges of the LED chip.

FIG. 4D is a cross-sectional view of an LED package 50 that is similar to the LED package 46 of FIG. 4B, and further includes the light-altering material 36 arranged around peripheral edges of the LED chip 28. In this arrangement, the light-altering material 36 may be formed on portions of the submount 30 that are uncovered by the lumiphoric material 20. As described above, a height of the light-altering material 36 relative to the submount 30 maybe less than, the same, or greater than a height of the LED chip 28 relative to the submount 30 depending on a width of the desired emission pattern for the LED package 50.

Figure 5A:
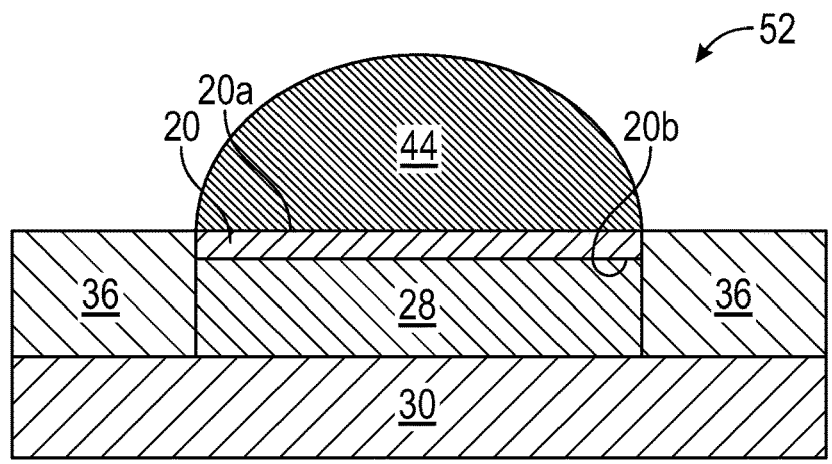
FIG. 5A is a cross-sectional view of an LED package where a lumiphoric material and a lens have lateral dimensions that correspond with lateral dimensions of an LED chip according to principles of the present disclosure.
Figure 5B:
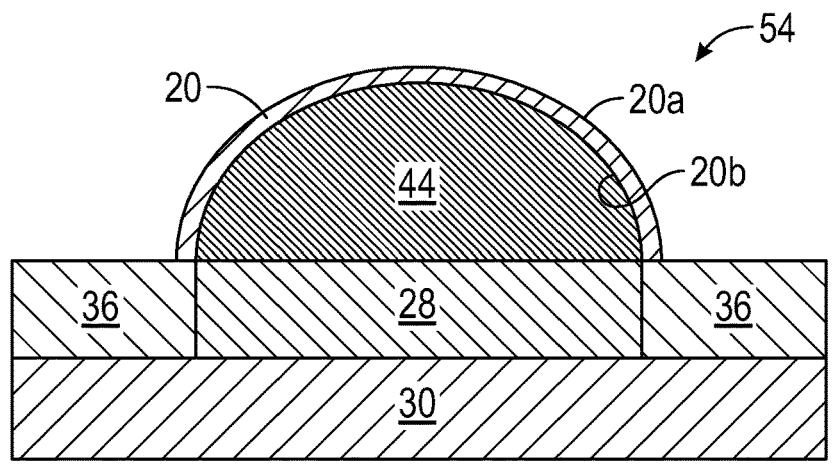
FIG. 5B is a cross-sectional view of an LED package that is similar to the LED package of FIG. 5A, but where the lumiphoric material is formed on an upper surface of the lens.
Figure 5C:
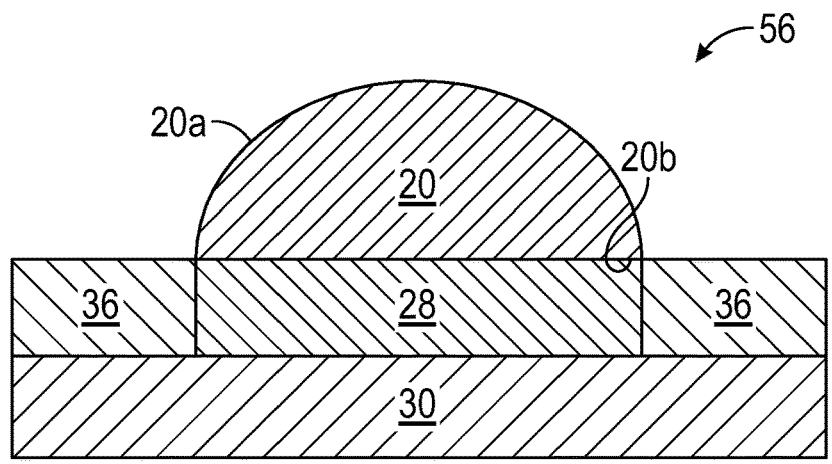
FIG. 5C is a cross-sectional view of an LED package where the lumiphoric material is formed with a shape that is similar to the lens of FIGS. 5A and 5B.

FIGS. 5A-5C illustrate cross-sectional views of LED packages with arrangements of lumiphoric materials relative to lenses. FIG. 5A is a cross-sectional view of an LED package 52 where the lumiphoric material 20 and the lens 44 have lateral dimensions that correspond with lateral dimensions of the LED chip 28. In certain embodiments, the lumiphoric material 20 may be applied, dried, and fired in place on the LED chip 28, before the lens 44 is formed. The lens 44 may then be molded or attached to the first face 20a of the lumiphoric material. Alternatively, the lumiphoric material 20 may be applied, dried, and fired in place on the lens 44 before the lens 44 is mounted on the LED chip 28. In such a sequence, the labels for the first face 20a and second face 20b of the lumiphoric material 20 in FIG. 5A would be reversed. In certain embodiments, the lens 44 and the lumiphoric material 20 may be provided on the LED chip 28 during chip-level processing before the LED chip 28 is mounted to the submount 30. After mounting, the light-altering material 36 may be formed as previously described. As with previous embodiments, multiple ones of the LED chip 28, the lumiphoric material 20, and the lens 44 may be provided on the submount 30.

FIG. 5B is a cross-sectional view of an LED package 54 where the lumiphoric material 20 is formed on an upper surface of the lens 44. As previously described, lumiphoric materials 20 of the present disclosure are capable of being provided in a variety of form factors. In FIG. 5B, the lumiphoric material 20 is applied, dried, and fired in place on the upper curved surface of the lens 44. In this manner, the lumiphoric material 20 is arranged remote from the LED chip 28 to reduce amounts of heat generated by the LED chip 28 that may otherwise reach the lumiphoric material 20. In certain embodiments, the lens 44 and lumiphoric material 20 may embody a pre-formed structure that is subsequently attached to the LED chip 28, while in other embodiments, the lens 44 and lumiphoric material 20 may be sequentially formed on the LED chip 28. As with previous embodiments, the principles described for FIG. 5B are also applicable to multiple-chip arrangements.

FIG. 5C is a cross-sectional view of an LED package 56 where the lumiphoric material 20 is formed with a shape that is similar to the lens 44 of FIGS. 5A and 5B. In such embodiments, the lumiphoric material 20 may be applied, dried, and fired in a mold that corresponds to a desired lens shape. Depending on the configuration of the mold, the first face 20a and the second face 20b may be arranged as illustrated in FIG. 5C or alternatively, in a reverse manner than what is illustrated in FIG. 5C. In this regard, the lumiphoric material 20 may embody both a wavelength conversion element and a lens that tailors a desired emission pattern for the LED package 56. As with previous embodiments, the principles described for FIG. 5C are also applicable to multiple-chip arrangements.

FIGS. 6A-6B illustrate cross-sectional views of exemplary multiple-chip LED packages with arrangements of lumiphoric materials according to principles of the present disclosure. FIG. 6A is a cross-sectional view of an LED package 58 where the lumiphoric material 20 is provided on multiple LED chips 28 and the corresponding submount 30 that supports the multiple LED chips 28. The lumiphoric material 20 may be applied, dried, and fired in place in a similar manner as described for the LED package 42 of FIG. 4A. Alternatively, the lumiphoric material 20 may be applied at a chip level on each of the LED chips 28 before mounting with the substrate 30 in a similar manner as described for the LED package 46 of FIG. 4B. After formation of the lumiphoric material 20, the light-altering material 36 may be formed in a ring or dam shape around portions of the submount 30 that are outside the mounting area of the LED chips 28. The light-altering material 36 may be dispensed and cured on the submount 30 to form a dam for receiving the material of the lens 44. In this manner, the lens 44 may comprise silicone or the like that is dispensed over the lumiphoric material 20, the LED chips 28, and the submount 30 while being retained by the light-altering material 36. In FIG. 6A, the lens 44 is illustrated with a flat top surface in cross-section, but the top surface may have a concave or convex shape relative to the submount 30. Additionally, while the light-altering material 36 is illustrated at peripheral edges of the submount 30, the light-altering material 36 may also be arranged at an inset position from peripheral edges of the submount 30. The LED package 58 may embody a chip-on-board package. The principles as described for FIG. 6A are also applicable to single LED chip 28 embodiments and embodiments where the submount 30 embodies a lead frame.

FIG. 6B is a cross-sectional view of an LED package 60 that is similar to the LED package 58 of FIG. 6A, but where the lumiphoric material 20 is formed to also embody a lens over the multiple LED chips 28. In this manner, the light-altering material 36 may initially be formed on the submount 30 in order to serve as a retention dam during application of the lumiphoric material 20. Accordingly, the lumiphoric material 20 may be dispensed over the LED chips 28 and the submount 30 in liquid form while being retained by the light-altering material 36, followed by drying and firing as previously described. As with FIG. 6A, the principles as described for FIG. 6B are also applicable to single LED chip 28 embodiments.

In further applications, the principles of the present disclosure may also apply to embodiments where binder materials are not loaded with lumiphoric particles or where binder materials include other particles, such as light-scattering particles that are provided with or without lumiphoric particles. In this regard, the process flow 10 as described for FIG. 1 may be followed without the lumiphoric particles or with the light-scattering particles provided in the colloidal solution with or without lumiphoric particles to form encapsulation and/or lenses for LED packages. In certain embodiments, light-scattering materials may be provided with a loading that allows light to pass through in a diffuse manner for improved overall light emission uniformity of an LED package. The light-scattering materials may comprise one or more of fused silica, fumed silica, zinc oxides, tantalum oxides, zirconium oxides, niobium oxides, yttrium oxides, alumina, glass beads, and $TiO_2$ that are suspended or embedded within the colloidal solution before drying and firing. Binder materials as disclosed herein may serve as encapsulation materials for LED chips that provide reduced permeability and improve hermetic sealing as compared with conventional encapsulation materials such as silicone.

FIG. 7A is a cross-sectional view of an LED package 62 that is similar to the LED package 60 of FIG. 6B, but where an encapsulation material 64 is formed according to the process flow 10 of FIG. 1 without lumiphoric particles. In this regard, the encapsulation material 64 may be formed with chemical glass or ceramic precursors such as metal oxide precursors that are applied to the LED package 60, subjected to a drying process to reduce liquid phase, and followed by a firing process. Accordingly, the resulting encapsulation material 64 may have a form factor capable of matching any current polymer binder processing capability while also providing notably higher thermal conductivity, on the order of at least 10 W/(m·K), or in a range from 10 W/(m·K) to 50 W/(m·K) in certain embodiments. In addition to improved thermal dissipation compared with conventional encapsulation materials, the encapsulation material 64 may further provide improved environmental protection for the LED chips 28. In certain embodiments, the encapsulation material 64 may be loaded with light-scattering particles that are distributed in a similar manner described for any of FIGS. 2A-2D. Accordingly, the drying process may allow the scattering particles to settle with higher concentrations near a second face 64b (e.g., a bottom face) than a first face 64a (e.g., a top face) of the encapsulation material 64. In further embodiments, the encapsulation material 64 may include both light-scattering particles and lumiphoric particles. The principles described for FIG. 7A may also be applicable to single-chip embodiments.

Figure 7B:
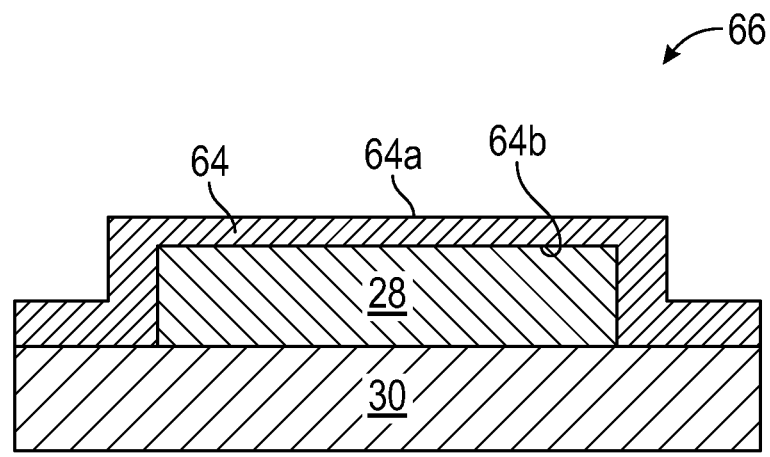
FIG. 7B is a cross-sectional view of an LED package that is similar to the LED package of FIG. 7A, but where the encapsulation material is formed is on the LED chip and the submount without necessarily requiring the light-altering material of FIG. 7A to serve as a retention dam.

FIG. 7B is a cross-sectional view of an LED package 66 that is similar to the LED package 62 of FIG. 7A, but where the encapsulation material 64 is formed on the LED chip 28 and the submount 30 without necessarily requiring the light-altering material 36 of FIG. 7A to serve as a retention dam. In this regard, the encapsulation material 64 as described for FIG. 7A may be spray-coated, spin coated, or otherwise applied to the LED chip 28 and the submount 30 and subsequently dried and fired in place. In certain embodiments, the resulting encapsulation material 64 may form a conformal shape such that the first face 64a and the second face 64b correspond with the shape of the LED chip 28 and portions of the submount 30 that are uncovered by the LED chip 28. The principles described for FIG. 7B may also be applicable to multiple-chip embodiments.

Figure 7C:
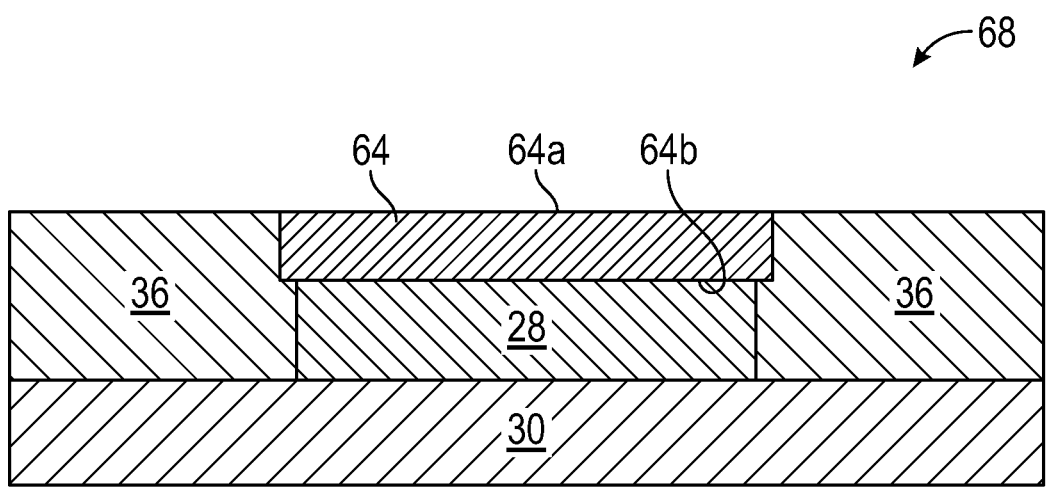
FIG. 7C is a cross-sectional view of an LED package that is similar to the LED package of FIG. 7A, but where the encapsulation material is a pre-formed structure that is subsequently attached to the LED package.

FIG. 7C is a cross-sectional view of an LED package 68 that is similar to the LED package 62 of FIG. 7A, but where the encapsulation material 64 is a pre-formed structure that is subsequently attached to the LED package 68. In this regard, the encapsulation material 64 may be formed as a larger sheet according to the process flow 10 of FIG. 1 that is subsequently singulated into individual pieces for attachment. As illustrated, the LED package 68 may include an LED chip 28 that is surrounded by the light-altering material 36 on the submount 30. The encapsulation material 64 may be attached to the LED chip 28 with transparent adhesive and portions of the light-altering material 36 may also serve to secure the encapsulation material 64 in place. In this regard, the encapsulation material 64 may embody a cover lens that provides environmental protection for the LED chip 28. While illustrated as planar in FIG. 7C, the encapsulation material 64 may form other lens shapes as described above for FIG. 4A.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:
1. A light-emitting device comprising:
a light-emitting diode (LED) chip; and
a lumiphoric material arranged to receive light emitted by the LED chip, the lumiphoric material comprising a plurality of lumiphoric particles in a binder, the lumiphoric material comprising a density of at least 1.8 grams per centimeter cubed (g/cm$^3$) and a weight percentage of lumiphoric particles that is at least 70%;
wherein the lumiphoric material comprises a first face and a second face that opposes the first face, wherein the plurality of lumiphoric particles are provided in a settled arrangement within the binder such that a highest concentration of the lumiphoric particles is in a region of the binder that is adjacent the second face.

2. The light-emitting device of claim 1, wherein the binder comprises a metal oxide binder.

3. The light-emitting device of claim 2, wherein the metal oxide binder comprises tin (Sn).

4. The light-emitting device of claim 2, wherein the metal oxide binder comprises aluminum (Al).

5. The light-emitting device of claim 1, wherein the density is in a range from 1.8 g/cm$^3$ to 10 g/cm$^3$.

6. The light-emitting device of claim 1, wherein the weight percentage of lumiphoric particles is at least 90%.

7. The light-emitting device of claim 1, wherein the lumiphoric material comprises a thermal conductivity in a range from 10 watts per meter per Kelvin (W/(m·K)) to 50 W/(m·K).

8. The light-emitting device of claim 1, wherein the lumiphoric material forms a nonplanar shape.

9. The light-emitting device of claim 8, wherein the nonplanar shape comprises a lens with a curved upper surface.

10. The light-emitting device of claim 1, wherein the plurality of lumiphoric particles are provided within the binder such that a region of the binder that is adjacent the first face is devoid of the plurality of lumiphoric particles.

11. The light-emitting device of claim 10, wherein the region of the binder that is devoid of the plurality of lumiphoric particles comprises a thickness in a range from 5 μm to 15 μm as measured from the first face.

12. The light-emitting device of claim 1, wherein the plurality of lumiphoric particles comprises a first distribution of lumiphoric particles and a second distribution of lumiphoric particles and the first distribution of lumiphoric particles is configured to provide a different wavelength of light emissions than the second distribution of lumiphoric particles.

13. The light-emitting device of claim 12, wherein the first distribution of lumiphoric particles and the second distribution of lumiphoric particles are mixed together in the binder.

14. The light-emitting device of claim 12, wherein the first distribution of lumiphoric particles and the second distribution of lumiphoric particles are provided in separate layers of the binder.

15. The light-emitting device of claim 1, wherein the lumiphoric material is provided on a light-transmissive support element.

16. The light-emitting device of claim 15, further comprising a submount, wherein the LED chip is mounted on the submount and the lumiphoric material is provided on the LED chip and on a surface of the submount that is uncovered by the LED chip.

17. A light-emitting device comprising:
a light-emitting diode (LED) chip; and
a lumiphoric material arranged to receive light emitted by the LED chip, the lumiphoric material comprising a plurality of lumiphoric particles in a binder, the lumiphoric material comprising a thickness of less than 100 microns (μm) and a thermal conductivity in a range from 10 watts per meter per Kelvin (W/(m·K)) to 50 W/(m·K);
wherein the lumiphoric material comprises a first face and a second face that opposes the first face, wherein the plurality of lumiphoric particles are provided in a settled arrangement within the binder such that a highest concentration of the lumiphoric particles is in a region of the binder that is adjacent the second face.

18. The light-emitting device of claim 17, wherein the binder comprises a metal oxide binder.

19. The light-emitting device of claim 17, wherein the thickness is in a range from 15 μm to less than 100 μm.

20. The light-emitting device of claim 17, wherein the plurality of lumiphoric particles are provided within the binder such that a region of the binder that is adjacent the first face is devoid of the plurality of lumiphoric particles.

21. The light-emitting device of claim 20, wherein the region of the binder that is devoid of the plurality of lumiphoric particles comprises a thickness in a range from 5 μm to 15 μm as measured from the first face.

22. The light-emitting device of claim 17, wherein the lumiphoric material is provided on a light-transmissive support element.

23. A light-emitting device comprising:
a light-emitting diode (LED) chip; and
an encapsulation material arranged to at least partially encapsulate the LED chip, the encapsulation material comprising a binder with a thermal conductivity in a range from 10 watts per meter per Kelvin (W/(m·K)) to 50 W/(m·K);
wherein the encapsulation material comprises a plurality of lumiphoric particles that are provided in a settled arrangement within the binder such that a highest concentration of the lumiphoric particles is adjacent the LED chip.

24. The light-emitting device of claim 23, wherein the encapsulation material completely encapsulates the LED chip.

25. The light-emitting device of claim 23, wherein the binder comprises a metal oxide binder.

26. The light-emitting device of claim 23, wherein the encapsulation material forms a coating on the LED chip.

27. The light-emitting device of claim 23, wherein the encapsulation material comprises a plurality of light-scattering particles in the binder.

28. The light-emitting device of claim 27, wherein the plurality of light-scattering particles is provided in a settled arrangement within the binder such that a highest concentration of the light-scattering particles is adjacent the LED chip.

* * * * *